US008793554B2

(12) United States Patent
Billing et al.

(10) Patent No.: US 8,793,554 B2
(45) Date of Patent: Jul. 29, 2014

(54) SWITCHABLE ON-DIE MEMORY ERROR CORRECTING ENGINE

(71) Applicant: Micron Technology, Inc., Boise, ID (US)

(72) Inventors: Gurkirat Billing, Lincoln, CA (US); Stephen Bowers, Woodland, CA (US); Mark Leinwander, Folsom, CA (US); Samuel David Post, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/946,492

(22) Filed: Jul. 19, 2013

(65) Prior Publication Data
US 2013/0305123 A1 Nov. 14, 2013

Related U.S. Application Data

(63) Continuation of application No. 12/495,081, filed on Jun. 30, 2009, now Pat. No. 8,495,467.

(51) Int. Cl.
| G11C 29/00 | (2006.01) |
| G11C 29/42 | (2006.01) |
| G11C 29/44 | (2006.01) |
| G06F 11/10 | (2006.01) |
| G06F 11/08 | (2006.01) |

(52) U.S. Cl.
CPC ............... *G11C 29/42* (2013.01); *G11C 29/44* (2013.01); *G06F 11/08* (2013.01); *G06F 11/1048* (2013.01)
USPC ........................................... 714/764

(58) Field of Classification Search
CPC .... G11C 29/42; G11C 29/44; G06F 11/1048; G06F 11/08
USPC .................. 714/763–764, 767, 769
See application file for complete search history.

(56) References Cited

U.S. PATENT DOCUMENTS

| 4,335,459 | A | 6/1982 | Miller |
| 5,363,484 | A | 11/1994 | Desnoyers et al. |
| 5,418,796 | A * | 5/1995 | Price et al. ............. 714/762 |
| 5,434,868 | A | 7/1995 | Aichelmann, Jr. et al. |
| 5,465,262 | A * | 11/1995 | Dell et al. ............. 714/802 |
| 5,530,673 | A | 6/1996 | Tobita et al. |
| 5,764,878 | A | 6/1998 | Kablanian et al. |
| 5,867,642 | A | 2/1999 | Vivio et al. |
| 5,974,564 | A | 10/1999 | Jeddeloh |
| 6,006,306 | A | 12/1999 | Haywood et al. |
| 6,067,262 | A | 5/2000 | Irrinki et al. |
| 6,236,602 | B1 | 5/2001 | Patti |
| 6,339,546 | B1 | 1/2002 | Katayama et al. |
| 6,467,048 | B1 | 10/2002 | Olarig et al. |
| 6,525,966 | B1 | 2/2003 | Hollmer et al. |
| 6,539,506 | B1 | 3/2003 | Lammers et al. |
| 6,651,202 | B1 | 11/2003 | Phan |
| 6,735,726 | B2 * | 5/2004 | Muranaka et al. ............ 714/708 |
| 6,848,070 | B1 * | 1/2005 | Kumar ........................ 714/758 |
| 6,941,505 | B2 | 9/2005 | Yada et al. |
| 7,043,672 | B2 | 5/2006 | Merritt |
| 7,233,054 | B1 | 6/2007 | Anh et al. |
| 7,346,815 | B2 | 3/2008 | Nowicki |

(Continued)

*Primary Examiner* — Shelly A Chase
(74) *Attorney, Agent, or Firm* — Knobbe, Martens, Olson & Bear LLP

(57) ABSTRACT

Subject matter disclosed herein relates to a user-switchable error correction coding (ECC) engine residing on a memory die.

20 Claims, 5 Drawing Sheets

(56) References Cited

U.S. PATENT DOCUMENTS

| | | |
|---|---|---|
| 7,373,562 B2 | 5/2008 | Poechmueller |
| 7,434,122 B2 | 10/2008 | Jo |
| 7,467,337 B2 | 12/2008 | Nakamura et al. |
| 7,519,875 B2 | 4/2009 | Rearick et al. |
| 7,644,323 B2 | 1/2010 | Wu et al. |
| 7,661,004 B2 | 2/2010 | May et al. |
| 7,757,135 B2 | 7/2010 | Nadeau-Dostie et al. |
| 7,858,960 B2 | 12/2010 | Chang |
| 7,908,530 B2 | 3/2011 | Chen |
| 2001/0004326 A1 | 6/2001 | Terasaki |
| 2004/0024961 A1 | 2/2004 | Cochran et al. |
| 2005/0120265 A1 | 6/2005 | Pline et al. |
| 2006/0156192 A1 | 7/2006 | Nakamura et al. |
| 2007/0006048 A1 | 1/2007 | Zimmer et al. |
| 2007/0038906 A1 | 2/2007 | Lakhani et al. |
| 2008/0010435 A1 | 1/2008 | Smith et al. |
| 2008/0049514 A1 | 2/2008 | Mondello et al. |
| 2009/0063914 A1 | 3/2009 | Owsley et al. |
| 2009/0132876 A1 | 5/2009 | Freking et al. |
| 2009/0287956 A1 | 11/2009 | Flynn et al. |
| 2010/0037005 A1 | 2/2010 | Kim et al. |
| 2010/0107004 A1 | 4/2010 | Bottelli et al. |

\* cited by examiner

SWITCHABLE ON-DIE MEMORY ERROR CORRECTING ENGINE

REFERENCE TO RELATED APPLICATIONS

This application is a continuation of U.S. patent application Ser. No. 12/495,081, filed Jun. 30, 2009, entitled SWITCHABLE ON-DIE MEMORY ERROR CORRECTING ENGINE, which is hereby incorporated by reference in its entirety and made part of this specification.

BACKGROUND

1. Field

Subject matter disclosed herein relates to a user-switchable error correction coding (ECC) engine residing on a memory die.

2. Information

Memory systems are employed in many types of electronic devices, such as computers, cell phones, PDA's, data loggers, and navigational equipment, just to name a few examples. Among such electronic devices, various types of nonvolatile memory systems may be employed, such as NAND or NOR flash memories, SRAM, DRAM, and phase-change memory, just to name a few examples. In general, writing or programming processes may be used to store information in such memory systems, while a read process may be used to retrieve stored information.

Such nonvolatile memory systems may comprise memory cells that slowly deteriorate over time, leading to an increasing probability that a read and/or write error may occur upon accessing such a memory cell. Accordingly, an error correction process may be employed to correct such errors as they occur. For example, an error correction coding (ECC) engine may be employed in a memory system in order to correct errors generated in the memory system. Typically, such an ECC engine may be limited in its ability to correct errors. If a number of errors occurs beyond such a capability, then an ECC engine may itself produce errors, thereby adding to the number of errors generated by the memory system.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
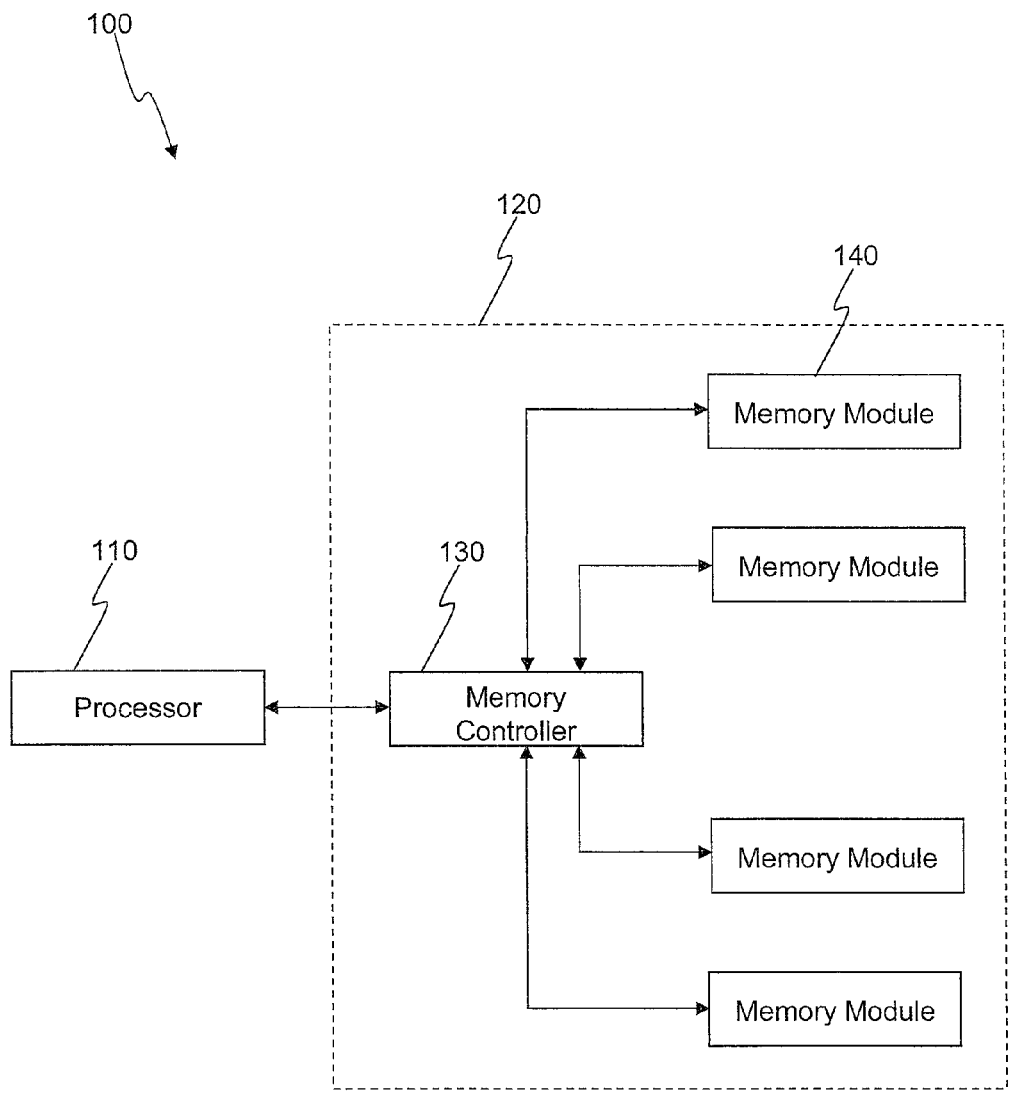
FIG. 1 is a schematic block diagram of a portion of a computing system, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, operation of an error correction code (ECC) decoder, or ECC engine, residing on a memory die, hereinafter referred to as an on-die ECC engine, may be switched on or off by a host computing system that incorporates a memory system comprising one or more such memory die. As described in detail below, such memory die may comprise a discrete semiconductor chip that is a portion of individual memory modules that collectively make up a larger memory system, for example. A system-level ECC engine, that is, an ECC engine deployed external to a memory die, for example, may be used in place of a disabled on-die ECC engine to correct read errors. Such a system-level ECC engine may provide an error correction capability beyond that of an on-die ECC engine. In a particular implementation, for example, such a system-level ECC engine may function across multiple memory die, thereby providing error correction for signals representative of data read from the multiple memory die. In such a case, it may be particularly desirable to switch off the on-die ECC engine residing on the individual memory die, since such on-die ECC engines may themselves generate errors and/or add a delay to a read process. For example, if an on-die ECC engine is presented with a number of errors beyond the ECC engine's capability to correct, then the ECC engine may introduce additional errors instead of eliminate errors. Accordingly, switching off or otherwise disabling an on-die ECC engine may prevent introduction of such additional errors as well as avoid delay resulting from operation of the on-die ECC engine. In one particular implementation, a system-level ECC engine and an on-die ECC engine may be enabled or disabled on-the-fly during read/write processes from/to a memory system. In another particular implementation, a system-level ECC engine and an on-die ECC engine may be enabled or disabled during a system configuration process, such as a memory drive format operation, for example. Of course, such details of an ECC engine are merely examples, and claimed subject matter is not so limited.

Embodiments, such as those described below, may involve a memory system comprising a phase-change memory (PCM) device. As a PCM ages, a bit error rate and/or a number of bit errors produced by portions of the PCM may increase. Such errors, to some extent, may be corrected using an on-die ECC engine and/or other such error correcting algorithms, for example. However, a number of errors may increase beyond a capability of such an on-die ECC engine to correct. Therefore, at some point during a lifetime of a memory device, it may be desirable to employ a system-level ECC engine, as described in detail below.

In an embodiment, a memory system using an external ECC engine applied across one or more die may provide a benefit of combining error probabilities of such die so that a number or errors per code word may remain below a threshold. For example, errors from multiple die may be combined in such a way that although there may be an error on multiple data transactions, a number of errors per code word, to which a correction process is applied, may be more probable to remain below a threshold of an ECC engine that corrects less bits externally than would be required to obtain the same result if an ECC engine were in a die. In other words, it may be easier to use one 3-bit ECC at a system level that is able to handle bits of many die than it is to obtain the same results by finding an appropriate equivalent ECC corrector inside a die.

In addition, an external corrector may be relatively easy to swap out for a larger corrector (e.g., a 6-bit ECC), if so desired.

FIG. 1 is a schematic block diagram illustrating a portion of a computing system 100, according to an embodiment. A processor 110 may process executable instructions to read/write signals representative of information from/to a memory system 120 via a memory controller 130. In a particular implementation, memory controller 130 may manage a flow of information between processor 110 and one or more memory modules 140. For example, memory controller 130 may manage read and/or write processes in response to instructions from processor 110. Memory controller 130 may be integrated with processor 110 or memory system 120, as indicated in FIG. 1, or may comprise a discrete semiconductor chip, for example. Memory system 120 may comprise a solid-state drive (SSD) memory that includes multiple memory modules 140 functionally arranged parallel with one another, for example. According to a particular embodiment, one or more portions of memory system 120 may store signals representative of data and/or information as expressed by a particular state of memory system 120. For example, an electronic signal representative of data and/or information may be "stored" in a portion of memory system by affecting or changing the state of such portions of memory system 120 to represent data and/or information as binary information (e.g., ones and zeros). As such, in a particular implementation, such a change of state of the portion of memory to store a signal representative of data and/or information constitutes a transformation of memory system 120 to a different state or thing. Of course, details of such a computing system are merely examples, and claimed subject matter is not so limited.

Figure 2:
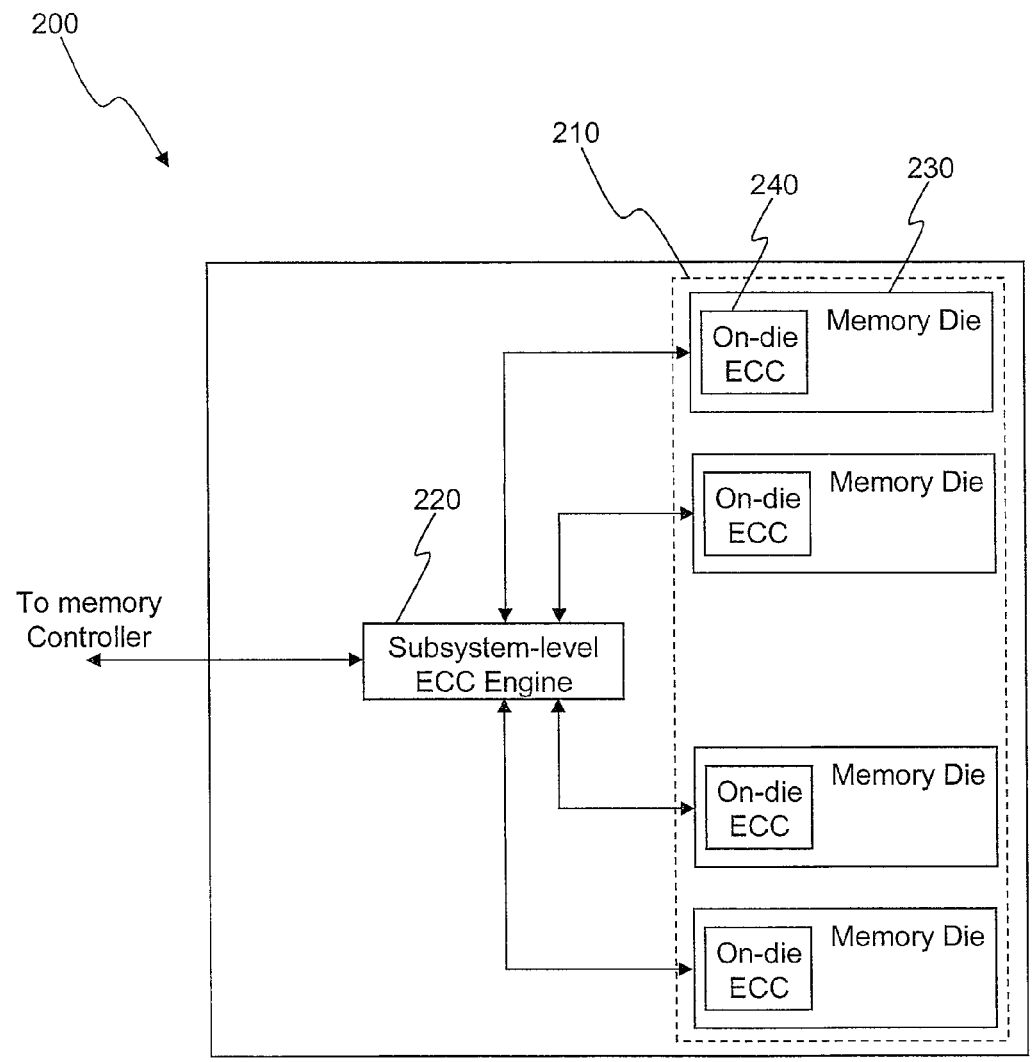
FIG. 2 is a schematic block diagram of a portion of a memory system, according to an embodiment.

FIG. 2 is a schematic block diagram illustrating a portion of a memory system 200, according to an embodiment. Such a portion may comprise memory module 140 shown in FIG. 1, for example. Memory system 200 may include die array 210 comprising one or more memory die 230 functionally arranged parallel with one another. Such a parallel arrangement may result in faster read/write speed compared with serially arranged memory die, for example. Memory system 200, however, is not limited to such a parallel arrangement. Memory die may be serially arranged by incorporating a capability to buffer read/write data as needed, for example.

Individual memory die 230 may include an on-die ECC engine 240 to correct read errors generated by the individual memory die. As discussed above, such an on-die ECC engine 240 may be switched on or off according to instructions from outside memory portion 200, for example. In one particular implementation, a subsystem-level ECC engine 220, which may comprise a separate device, may be employed if, for example, on-die ECC engine 240 is switched off or otherwise disabled. Here, the term subsystem indicates that such a subsystem-level ECC engine 220 may reside external to die array 210, whereas a system-level ECC engine, discussed below, may reside external to memory system 120, shown in FIG. 1, for example. In another particular implementation, subsystem-level ECC engine 220 may be employed to provide subsystem-level error correction across multiple memory die 230. Such subsystem-level error correction may involve improved performance compared to error correction employed at a memory die level, such as by on-die ECC engine 240, for example. Here, performance may be measured in terms of capability to correct errors, delay, flexibility of applying such error correction, and/or time/latency involved with correcting errors. If subsystem-level ECC engine 220 is employed, then it may be desirable to switch off or otherwise disable on-die ECC engine 240 residing on individual memory die 230 to avoid errors and delay generated by such on-die ECC engines, as discussed above. Of course, details of such a memory configuration are merely examples, and claimed subject matter is not so limited.

Figure 3:
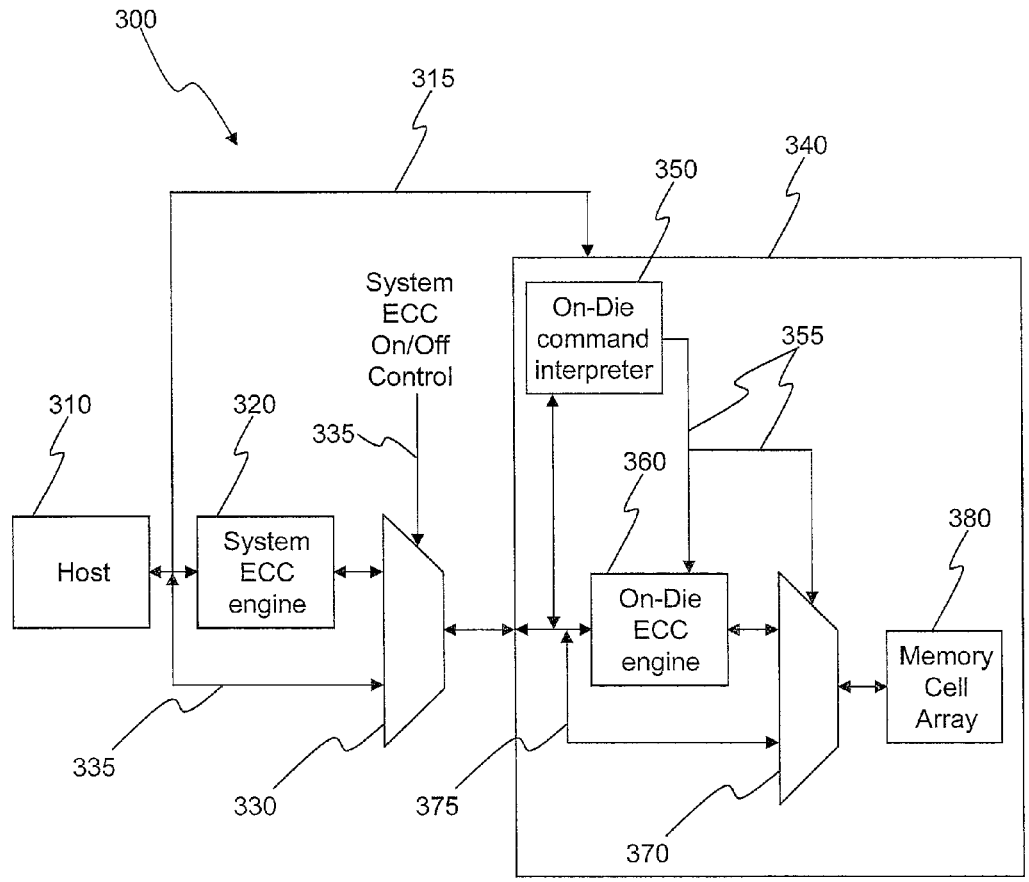
FIG. 3 is a schematic block diagram of a system and one or more aspects of a memory configuration, according to an embodiment.

FIG. 3 is a schematic block diagram illustrating a system 300 and details of a memory configuration, according to an embodiment. A memory die 340, such as memory die 230 shown in FIG. 2 for example, may include an on-die command interpreter 350, an on-die ECC engine 360, a multiplexer 370, and a memory cell array 380 comprising, for example, an array of memory cells. On-die ECC engine 360, configured to correct read errors generated by memory cell array 380, may be switched on or off according to signals provided by on-die command interpreter 350. External to memory die 340, a host 310 may provide system level instructions via line 315, for example, to on-die command interpreter 350 that determine whether on-die command interpreter 350 is to provide such an on/off signal to on-die ECC engine 360 and multiplexer 370, according to one implementation. Such a host, for example, may comprise a memory controller or a processor, such as processor 110 shown in FIG. 1. In detail, on-die command interpreter 350 may provide an on/off control signal to multiplexer 370 via line 355, wherein such an on/off control signal may determine, at least in part, whether signals representative of read data from memory cell array 380 bypass on-die ECC engine 360 via line 375, for example. Line 355 may also provide such an on/off control signal to on-die ECC engine 360 to turn on or off on-die ECC engine 360. In one implementation, on-die ECC engine 360 may be switched off to avoid consuming power if on-die ECC engine 360 is to be bypassed. Of course, such a description of an on/off control signal is merely an example, and claimed subject matter is not so limited.

In one embodiment, there may be tradeoffs in using an on-die ECC engine versus using a system-level ECC engine, and vise versa. Such tradeoffs may involve performance, flexibility, and reliability of a system, such as system 300, for example. Performance may be determined by comparing probabilities of system level errors using either an internal ECC engine, an external ECC engine, or both an internal and external ECC engine, for example. In one implementation, whether an on-die ECC engine is faster than a system-level ECC engine may be tracked by host 310, which may also monitor a bit error rate (BER) from such various ECC engines. If either ECC engine is able to handle the BER that is present at a particular time, then such a host may determine that the slower ECC engine is to be turned off. Such a determination may be made during run-time, for example.

System 300, according to an embodiment, may also include a system-level ECC engine 320 that may be employed if, for example, on-die ECC engine 360 is switched off or otherwise disabled. Here, the term system-level indicates that such an ECC engine may be deployed external to memory die 340 and/or other larger portion of memory, such as memory module 140 and/or memory system 120 shown in FIG. 1, for example. Similar to a process involving subsystem-level ECC engine 220 mentioned above, system-level ECC engine 320 may be employed to provide system-level error correction across multiple memory die 340, for example. In one implementation, such system-level error correction may involve a system-level ECC engine 320 to perform error correction functions that would otherwise be carried out by multiple individual on-die ECC engines. In one embodiment, a system-level ECC engine may be more robust (e.g., capable of correcting more bits) than an on-die ECC engine. System-level error correction across multiple memory die may provide improved performance compared to error correction employed at a memory die level, such as by on-die ECC engine 360, for example. As discussed above, if system-level ECC engine 320 is employed, then it may be desirable to switch off or otherwise disable on-die ECC engine 360 residing on memory die 340 to avoid errors and delay generated by such an on-die ECC engine, and to avoid power consumption by on-die ECC engine 360. On the other hand, system-level ECC engine 320 may be switched off or otherwise disabled if, for example, on-die ECC engine 360 is selected to be employed. In another embodiment, however, both on-die ECC engine 360 and system-level ECC engine 320 may both be enabled to operate at the same time. A multiplexer 330 may receive a signal 335 that may determine, at least in part, whether signals representative of read data from memory die 340 bypass system-level ECC engine 320 via line 335, for example. Of course, details of such a system and memory configuration are merely examples, and claimed subject matter is not so limited.

Figure 4:
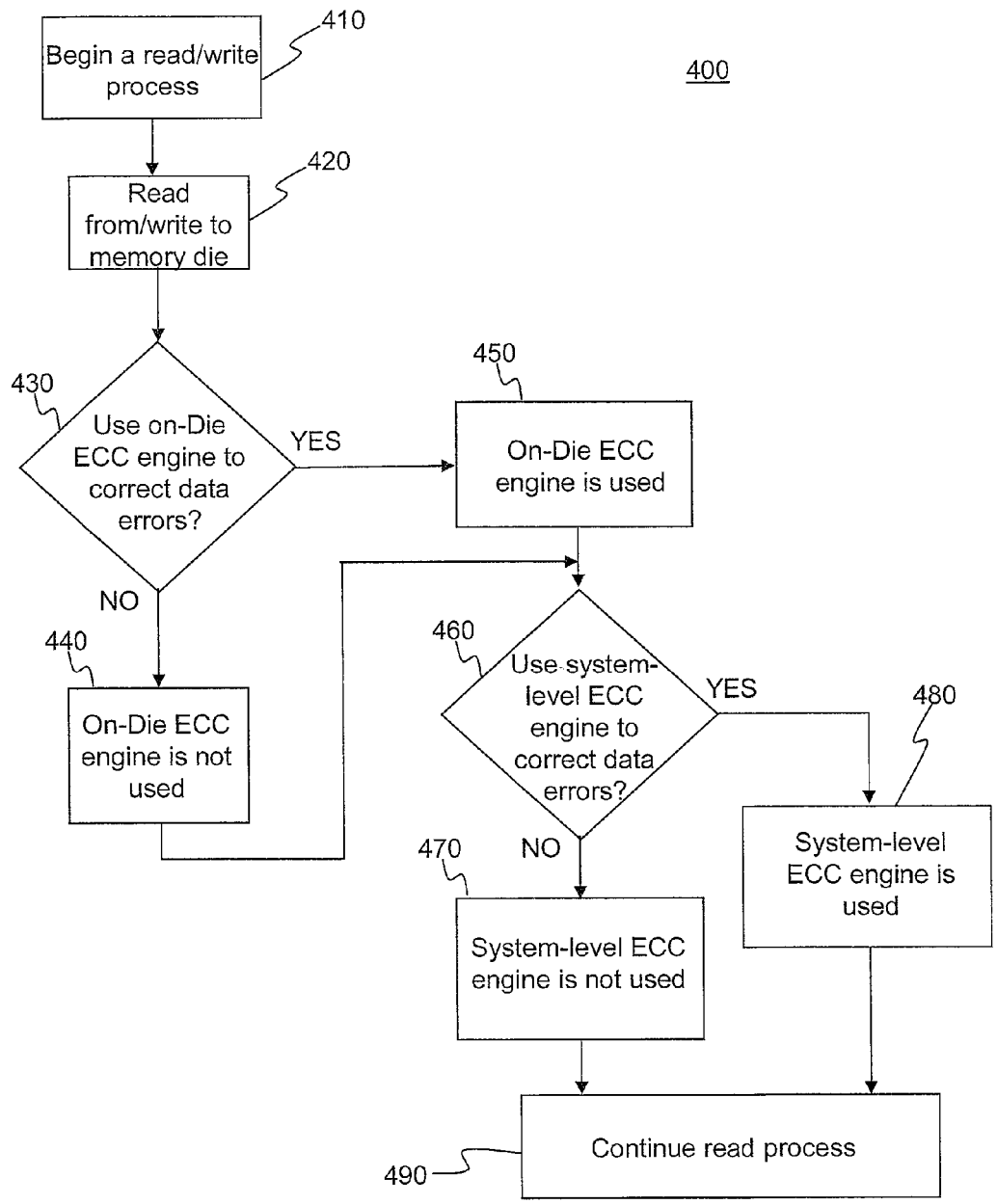
FIG. 4 is a flow diagram illustrating a read process, according to an embodiment.

FIG. 4 is a flow diagram illustrating a read/write process, according to an embodiment. Such a process may employ systems and/or memory system embodiments described above, though claimed subject matter is not so limited. At block 410, a read/write process to read/write to a portion of a memory system may be initiated, for example, by a system application that provides one or more read/write addresses to respectively identify one or more memory locations from where stored signals representative of information is to be read or where data is to be written. At block 420, signals representative of data may be read from/written to such memory locations. Signals representative of read/write data may include errors generated at the memory system from where such data is read or written to. Accordingly, an ECC engine may be employed to correct such errors. At block 430, a question, however, may remain as to which ECC engine to select for such an error correcting process; an on-die ECC engine or a system-level ECC engine. As discussed above, an answer to such a question may, at least in part, depend on which ECC engine may provide the best performance in terms of capability to correct errors, delay, and/or flexibility of applying such error correction. On-die ECC engine, at block 440, may, if not already, be disabled if it is determined not to use the on-die ECC engine. On the other hand, if a determination is made to employ the on-die ECC engine, then, at block 450, on-die ECC engine may, if not already, be enabled.

In one embodiment, a die-level ECC engine may be configured by a memory system during runtime, wherein software and/or executable code may determine, as in block 430, such configurations based, at least in part, on real-time system level information, for example. Such information may be gathered by a memory system and subsequently used to characterize memory system. For example, as memory die within such a system deteriorate, errors appear and may increase in number to where internal ECC engines may no longer be capable of correcting errors. In such a case, system-level software, for example, may determine that an external ECC engine is to be incorporated in order to deal with such an increased number of errors, and one or more internal ECC engines may then be eliminated. Such a determination, in one particular implementation, may be performed on-the-fly, though claimed subject matter is not so limited.

At block 460, a determination is made as to whether a system-level ECC engine is to be employed. Again, an answer to such a question may, at least in part, depend on which ECC engine or combination of engines may provide the best performance in terms of capability to correct errors, delay, and/or flexibility of applying such error correction. For example, some considerations regarding such performance may include code size (how large a block of memory may be corrected), number of bits that may be corrected in the code size, latency involved with error correction, error-correcting techniques used and types of errors that may be corrected (insertions, deletions, altered bits, etc). For example, an ECC engine presented with a 4K code word may be able to correct 3 bits in several nanoseconds, using the Reed Solomon or BCH techniques. System-level ECC engine, at block 470, may, if not already, be disabled if it is determined not to use a system-level ECC engine. On the other hand, if a determination is made to employ a system-level ECC engine, then, at block 480, system-level ECC engine may, if not already, be enabled. With the appropriate ECC engines either enabled or disabled, the read process initiated at block 410 may continue at block 490. Of course, details of such a read process are merely examples, and claimed subject matter is not so limited.

Figure 5:
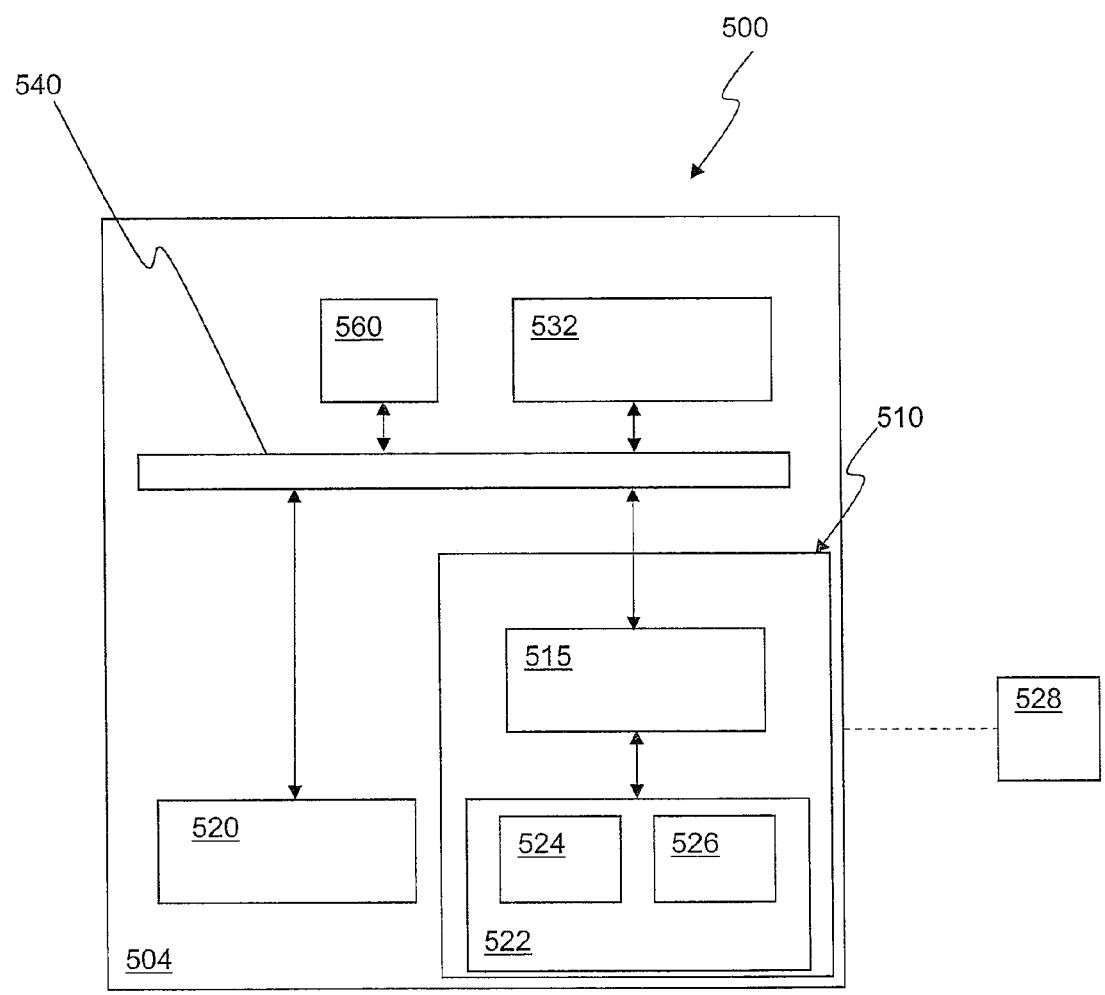
FIG. 5 is a schematic block diagram illustrating a computing system and a memory system, according to an embodiment.

FIG. 5 is a schematic block diagram illustrating a computing system 500 and a memory system 510, according to an embodiment. A computing device 504 may be representative of any device, appliance, and/or machine that may be configurable to manage memory system 510. Memory system 510 may include a memory controller 515 and a memory 522. By way of example but not limitation, computing device 504 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 500, and the processes and methods as further described herein, may be implemented using or otherwise including hardware, firmware, software, or any combination thereof. Thus, by way of example but not limitation, computing device 504 may include at least one processing unit 520 and system-level ECC engine 560 that are operatively coupled to memory 522 through a bus 540 and a host or memory controller 515. Processing unit 520 is representative of one or more circuits configurable to perform at least a portion of a data computing procedure or process. By way of example but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may communicate with memory controller 515 to process memory-related operations, such as read, write, and/or erase, as well as memory partition processes discussed above, for example. Processing unit 520 may include an operating system configured to communicate with memory controller 515. Such an operating system may, for example, generate commands to be sent to memory controller 515 over bus 540. Such commands may include instructions to enable and/or disable on-die and/or system-level ECC engines, as described above, for example.

Memory 522 is representative of any data storage mechanism. Memory 522 may include, for example, a primary memory 524 and/or a secondary memory 526. In a particular embodiment, memory 522 may comprise memory that may be partitioned based at least in part on one or more attributes of the memory and/or a memory management process, as described above. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

Secondary memory 526 may include, for example, the same or similar type of memory as primary memory and/or one or more data storage devices or systems, such as, for example, a disk drive, an optical disc drive, a tape drive, and/or a solid state memory drive, which may comprise multiple memory die that individually include an on-die ECC engine (not shown in FIG. 5), for example. In certain implementations, secondary memory 526 may be operatively receptive of, or otherwise configurable to couple to, a computer-readable medium 528. Computer-readable medium 528 may include, for example, any medium that can carry and/or make accessible data, code, and/or instructions for one or more of the devices in system 500.

Computing device 504 may include, for example, an input/output 532. Input/output 532 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 532 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Some portions of the detailed description above are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method of correcting data errors generated by a memory array of a memory die in a memory device, the method comprising:
   reading data stored in the memory array;
   detecting an error in the read data;
   determining whether to correct the error using an on-die correction coding engine or using an error correction coding engine located externally from the memory die; and
   correcting the error using the on-die error correction coding engine or using the error correction coding engine located externally from the memory die, the memory device comprising both the on-die error correction coding engine and the error correction coding engine located externally from the memory die.

2. The method of claim 1, further comprising correcting errors in read data from at least one additional memory die using the error coding engine located externally from the memory die, the memory device comprising the at least one additional memory die.

3. A method of correcting data errors generated by a memory array of a memory die in a memory device, the method comprising:
   reading data stored in the memory array;
   detecting an error in the read data;

determining whether to bypass an on-die error correction coding engine or an error correction coding engine located externally from the memory die; and correcting the error using the on-die error correction coding engine or using the error correction coding engine located externally, from the memory die, the memory device comprising both the on-die error correction coding engine and the error correction coding engine located externally from the memory die.

4. The method of claim 3, further comprising performing the determining during reading the data stored in the memory array.

5. The method of claim 3, further comprising performing the determining during a configuration process of the memory device.

6. The method of claim 3, wherein the determining is based on at least one performance parameter of the memory device, the at least one performance parameter including: a number of detected errors in the read data, a latency performance of the on-die error correction coding engine, a latency performance of the error correction coding engine located externally from the memory die, an error type of the detected errors, and an error correction technique suitable for correcting the detected errors.

7. The method of claim 6, further comprising tracking the at least one performance parameter in real-time.

8. A method of correcting data errors generated by a memory array of a memory die in a memory device, the method comprising:

reading, data stored in the memory array;

detecting an error in the read data; and correcting the error using an on-die error correction coding engine or using an error correction coding engine located externally from the memory die, the memory device comprising both the on-die error correction coding engine and the error correction coding engine located externally from the memory die, and the error correction coding engine located externally from the memory die having a greater error correction capacity than an error correction capacity of the on-die error correction coding engine.

9. The method of claim 8, wherein correcting the error is performed by the error correction coding engine located externally from the memory die when a number of errors generated by the memory array increases beyond the error correction capacity of the on-die error correction coding engine.

10. A memory device, the device comprising:
a memory die including a memory array; and
an on-die error correction coding engine and an error correction coding engine located externally from the memory die, each error correction coding engine configured to:
receive data read from the memory array;
detect errors in the data read from the memory array; and
correct the errors in the data read from the memory array; and
a memory controller configured to determine whether to correct the errors using the on-die correction coding engine or using the error correction coding engine located externally from the memory die.

11. A memory; device, the device comprising:
a memory die including a memory array;
an on-die error correction coding engine and an error correction coding engine located externally from the memory die, each error correction coding engine configured to:
receive data read from the memory array;
detect errors in the data read from the memory array; and
correct the errors in the data read from the memory array; and
a memory controller configured to determine whether to bypass the on-die error correction coding engine or the error correction coding engine located externally from the memory die.

12. A memory device, the device comprising:
a memory die including a memos array;
an on-die error correction coding engine and an error correction coding engine located externally from the memory die, the error correction coding engine located externally from the memory die having a greater error correction capacity than an error correction capacity of the on-die error correction coding engine, and each error correction coding engine configured to:
receive data read from the memory array;
detect errors in the data read from the memory array; and
correct the errors in the data read from the memory array.

13. The device of claim 10, further comprising at least one additional memory die connected in parallel with the memory die.

14. The device of claim 13, wherein the error correction coding engine located externally from the memory die is configured to provide data error correction for both the memory die and the at least one additional memory die.

15. The device of claim 11, wherein the determining is performed during a runtime of the memory device.

16. The device of claim 11, wherein the determining is performed during a configuration process of the memory device.

17. A system, comprising:
a memory die including a memory array;
a processor configured to process executable instructions to read data from the memory array; and
an on-die error correction coding engine and an error correction coding engine located externally from the memory die, each error correction coding engine configured to:
receive data read from the memory array;
detect errors in the data read from the memory array; and
correct the errors in the data read from the memory array; and
a memory controller configured to determine whether to correct the errors using the on-die correction coding engine or using the error correction coding, engine located externally from the memory die.

18. A system, comprising:
a memory die including a memory array;
a processor configured to process executable instructions to read data from the memory array; and
an on-die error correction coding engine and an error correction coding engine located externally from the memory die, each error correction coding engine configured to:
receive data read from the memory array;
detect errors in the data read from the memory array; and
correct the errors in the data read from the memory array; and
a memory controller configured to determine whether to bypass the on-die error correction coding engine or the error correction coding engine located externally from the memory die.

19. The system of claim 18, wherein the determining is performed during a runtime of the system.

20. The system of claim 17, further comprising at least one additional memory die, wherein the error correction coding engine located externally from the memory die is configured to provide data error correction for both the memory die and the at least one additional memory die.

* * * * *

UNITED STATES PATENT AND TRADEMARK OFFICE
CERTIFICATE OF CORRECTION

Page 1 of 1

PATENT NO. : 8,793,554 B2
APPLICATION NO. : 13/946492
DATED : July 29, 2014
INVENTOR(S) : Gurkirat Billing et al.

It is certified that error appears in the above-identified patent and that said Letters Patent is hereby corrected as shown below:

On the title page, item (72), under "Inventors", in column 1, line 4, delete "Folsom," and insert -- San Jose, --, therefor.

In the Claims

Column 9, line 6, in claim 3, delete "externally," and insert -- externally --, therefor.

Column 9, line 30, in claim 8, delete "reading," and insert -- reading --, therefor.

Column 9, line 62, in claim 11, delete "memory;" and insert -- memory --, therefor.

Column 10, line 10, in claim 12, delete "memos" and insert -- memory --, therefor.

Column 10, line 48, in claim 17, delete "coding," and insert -- coding --, therefor.

Signed and Sealed this
Thirtieth Day of September, 2014

Michelle K. Lee
*Deputy Director of the United States Patent and Trademark Office*